(12) United States Patent
Iinuma

(10) Patent No.: US 7,964,906 B2
(45) Date of Patent: Jun. 21, 2011

(54) SEMICONDUCTOR DEVICE AND METHOD OF MANUFACTURING SAME

(75) Inventor: Toshihiko Iinuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 717 days.

(21) Appl. No.: 11/873,745

(22) Filed: Oct. 17, 2007

(65) Prior Publication Data

US 2008/0128779 A1 Jun. 5, 2008

(30) Foreign Application Priority Data

Oct. 18, 2006 (JP) ................................ 2006-283546

(51) Int. Cl.
*H01L 29/788* (2006.01)
(52) U.S. Cl. .. 257/315; 257/316; 257/324; 257/E29.003
(58) Field of Classification Search .......... 257/315–316, 257/E29.003, 324
See application file for complete search history.

(56) References Cited

U.S. PATENT DOCUMENTS

| 5,989,988 | A | 11/1999 | Iinuma et al. |
| 6,207,492 | B1 | 3/2001 | Tzeng et al. |
| 6,372,641 | B1 | 4/2002 | Lien |
| 6,413,820 | B2 * | 7/2002 | Bui ............................. 438/257 |
| 6,770,942 | B2 | 8/2004 | Iinuma |
| 2003/0210582 | A1 * | 11/2003 | Kinoshita ..................... 365/200 |

* cited by examiner

*Primary Examiner* — Cuong Q Nguyen
*Assistant Examiner* — Trang Q Tran
(74) *Attorney, Agent, or Firm* — Finnegan, Henderson, Farabow, Garrett & Dunner, L.L.P.

(57) ABSTRACT

A semiconductor device has a semiconductor layer, a plurality of charge-accumulating layers formed at a predetermined interval from each other on said semiconductor layer through a first insulating film, a second insulating film formed on said charge-accumulating layer, a control gate including a silicide film formed on said second insulating film, a third insulating film formed between said control gates so that the top surface of said third insulating film is lower than the top surface of said control gate but is higher than the top surface of said second insulating film, a fourth insulating film formed into a concave shape so as to cover the top surface of said third insulating film and the side surfaces of said control gate positioned higher than the top surface of said third insulating film, and a fifth insulating film formed on said control gate and said fourth insulating film.

8 Claims, 8 Drawing Sheets (A)

(B)

GROWTH OF SILICON DIOXIDE FILM BASED ON CVD METHOD

SEMICONDUCTOR DEVICE AND METHOD OF MANUFACTURING SAME

CROSS REFERENCE TO RELATED APPLICATIONS

This application is based upon and claims benefit of priority from the Japanese Patent Applications No. 2006-283546, filed on Oct. 18, 2006, the entire contents of which are incorporated herein by reference.

BACKGROUND OF THE INVENTION

1. Field of the Invention

The present invention relates to a semiconductor device and a method of manufacturing the same.

2. Related Art

In order to reduce the parasitic resistance of word lines of a flash memory device, a tungsten silicide film is used for the word lines.

However, the word line width of a flash memory device has been diminished along with the recent miniaturization of semiconductor devices. Consequently, it has become increasingly difficult to sufficiently reduce the parasitic resistance of word lines by still utilizing the resistivity (approximately 50 μΩ·cm) of the tungsten silicide film.

Hence, there has been proposed a method of using a cobalt silicide film, titanium silicide film (approximately 20 μΩ·cm), or the like, the resistivity of which is lower than that of the tungsten silicide film for word lines. These silicide films can be formed using a salicide process. The term "salicide" refers to a silicide made in a self-aligned manner. A salicide can be formed by forming a film of metal on word lines (polysilicon), forming a silicide by applying heat treatment to cause the metal to react with silicon, and removing excess metal using a chemical solution.

Prior to forming a cobalt silicide film on word lines using a salicide process, an insulating film, such as a silicon dioxide film, is buried between word lines using a chemical vapor deposition (CVD) method. When burying a silicon dioxide film in a thin, deep trench, such as one between word lines, using a CVD method, the surfaces of portions of the silicon dioxide film being deposited on the side surfaces of a word line come into contact with each other in the course of film forming. After such contact, a reactant gas for CVD is no longer supplied. Consequently, a joint line (seam) is formed in the center of the silicon dioxide film buried between word lines. Before a cobalt silicide film is formed, a natural oxide film present on the surfaces of word lines (polysilicon) is removed by etching treatment using dilute fluorinated acid or the like. At that time, the abovementioned seam, which is vulnerable to etching using dilute fluorinated acid or the like, expands in a groove-like manner.

After the formation of the cobalt silicide film, a silicon nitride film is deposited on the entire surface of a substrate. Between word lines in the silicon dioxide film, there is a trench formed by etching using dilute fluorinated acid or the like, and the silicon nitride film having a large dielectric constant is buried in this trench. Consequently, the proposed method has had the problem that capacitance between word lines increases, thereby causing the signal writing/reading speed of a flash memory device to decrease.

The proposed method also has had the problem that when a silicide film is used for a control gate, capacitance increases for reasons of, for example, wiring lines being too close to each other due to a reduction in the distance therebetween caused by miniaturization.

SUMMARY OF THE INVENTION

According to one aspect of the present invention, there is provided a semiconductor device comprising:

a semiconductor layer;

a plurality of charge-accumulating layers formed at a predetermined interval from each other on said semiconductor layer through a first insulating film;

a second insulating film formed on said charge-accumulating layer;

a control gate including a silicide film formed on said second insulating film;

a third insulating film formed between said control gates so that the top surface of said third insulating film is lower than the top surface of said control gate but is higher than the top surface of said second insulating film;

a fourth insulating film formed into a concave shape so as to cover the top surface of said third insulating film and the side surfaces of said control gate positioned higher than the top surface of said third insulating film; and a fifth insulating film formed on said control gate and said fourth insulating film.

According to one aspect of the present invention, there is provided a method of manufacturing a semiconductor device, comprising:

forming a first insulating film on a semiconductor layer;

forming a first electrode layer serving as a charge-accumulating layer on said first insulating film;

forming a plurality of first trenches at a predetermined interval along a first direction by etching said first electrode layer, said first insulating film and said semiconductor layer;

burying element-isolating insulating films within said first trenches so that the top surfaces of said element-isolating insulating films are higher than the surface of said semiconductor layer but are lower than the top surface of said first electrode layer;

forming a second insulating film so as to cover the surface of said first electrode layer and the top surfaces of said element-isolating insulating films;

forming a second electrode layer serving as a control gate on said second insulating film;

forming a plurality of word lines at a predetermined interval along a second direction orthogonal to said first direction;

forming a third insulating film so as to fill a portion between said word lines to a depth lower than the top surface of said second electrode layer and to a height higher than the top surface of said second insulating film;

forming a concave fourth insulating film so as to cover the side surfaces of a portion between said word lines and the top surface of said third insulating film;

removing a natural oxide film on said second electrode layer;

forming a metal film on said second electrode layer;

forming a silicide layer by reacting said second electrode layer with said metal film;

removing unreacted portions of said metal film; and forming a fifth insulating film on said silicide layer and said fourth insulating film.

DETAILED DESCRIPTION OF THE INVENTION

Hereinafter, a semiconductor device and a method of manufacturing the same according to embodiments of the present invention will be described with reference to the accompanying drawings.

Figure 1:
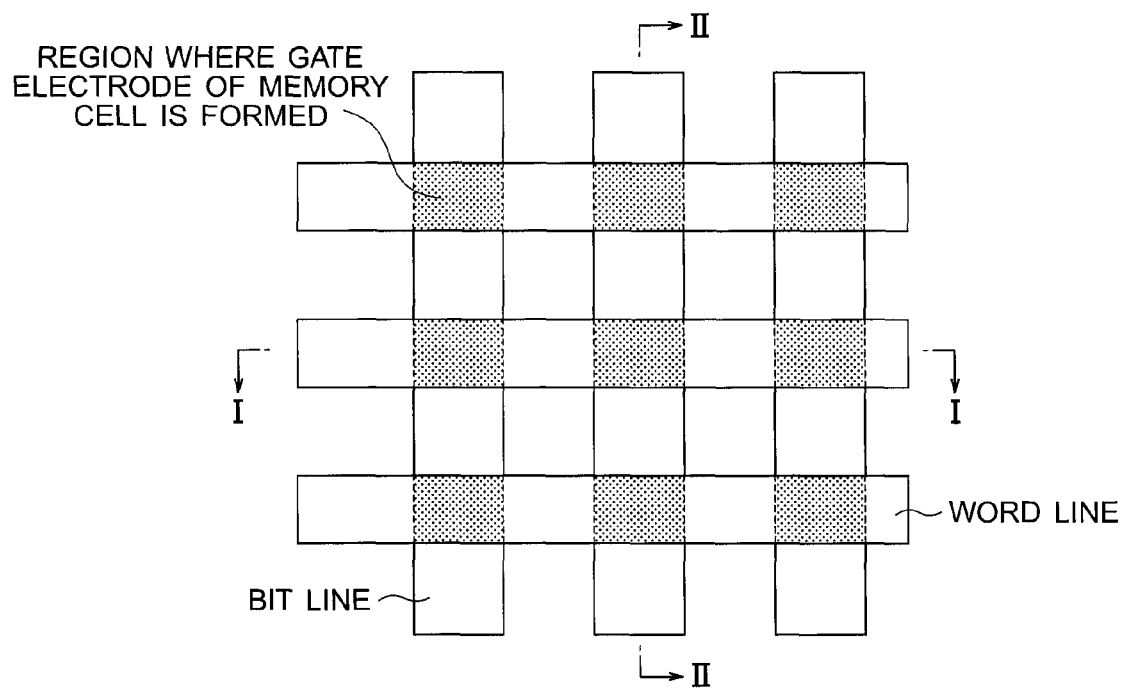
FIG. 1 is a schematic view illustrating the top surface of a semiconductor device in accordance with an embodiment of the present invention.

FIG. 1 is a schematic view illustrating the top surface of a semiconductor device in accordance with an embodiment of the present invention. The semiconductor device has a plurality of bit lines formed at a predetermined interval along a first direction and a plurality of word lines formed at a predetermined interval along a second direction orthogonal to the first direction. A memory cell is formed in correspondence with each intersection of a word line and a bit line and a gate electrode of the memory cell is formed in each intersection.

Figure 2:
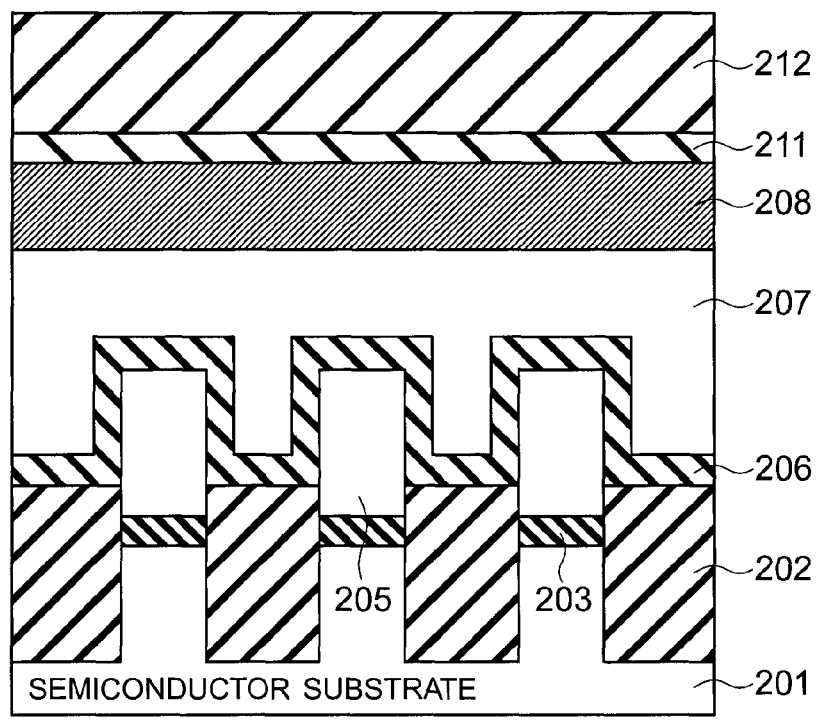
FIG. 2 is a schematic view illustrating a cross section of the semiconductor device in accordance with the aforementioned embodiment.

FIG. 2 illustrates a cross-sectional view in the word line direction (along the I-I line shown in FIG. 1) of the semiconductor device. On a semiconductor substrate 201, there are formed a plurality of buried element-isolating regions 202 at a predetermined interval. A tunnel-insulating film 203 is formed on the semiconductor substrate 201 between element-isolating regions 202. On each tunnel-insulating film 203, there is formed a floating gate electrode 205 the top surface of which is higher than the top surface of each element-isolating region 202.

An inter-poly insulating film 206 is formed on the floating gate electrodes 205 and the element-isolating regions 202. The inter-poly insulating film 206 is of concavo-convex shape according to the surface shapes of the underlying floating gate electrodes 205 and the element-isolating regions 202.

On this inter-poly insulating film 206, there is formed a control gate electrode 207. The bottom surface of this control gate electrode 207 is of concavo-convex shape according to the surface shape of the underlying inter-poly insulating film 206.

On the control gate electrode 207, there is formed a cobalt disilicide ($CoSi_2$) film 208. A silicon nitride film 211 is formed on the cobalt disilicide film 208 and a silicon dioxide film 212 is formed on the silicon nitride film 211.

Figure 3:
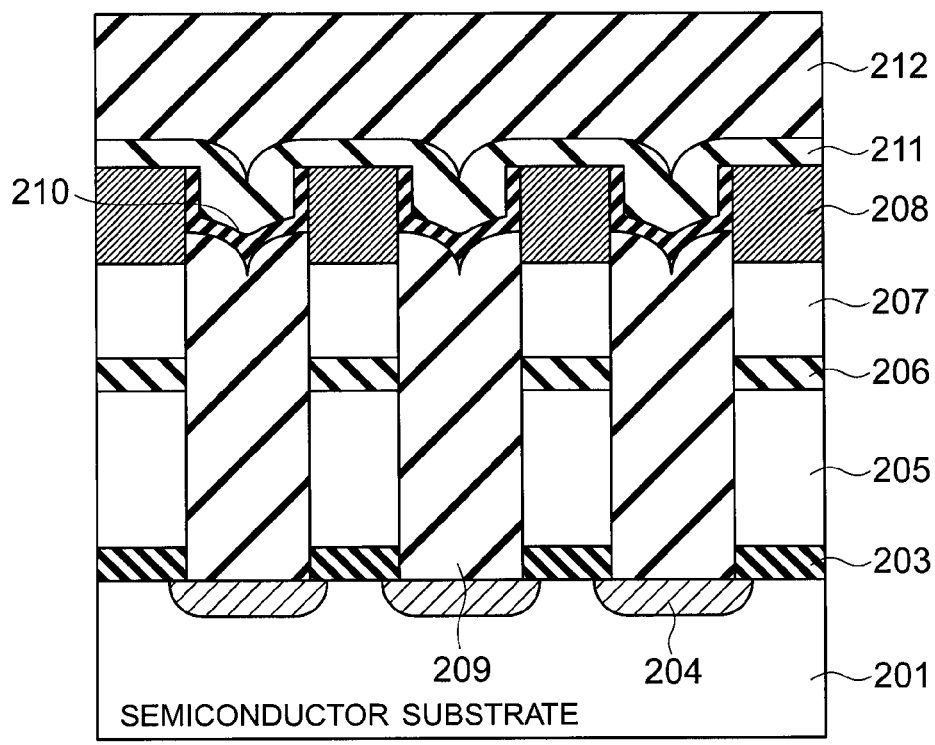
FIG. 3 is another schematic view illustrating a cross section of the semiconductor device in accordance with the aforementioned embodiment.

FIG. 3 illustrates a cross-sectional view in the bit line direction (along the II-II line shown in FIG. 1) of the semiconductor device. Impurity-diffused layers 204 are formed at a predetermined interval on the surface of the semiconductor substrate 201. Each tunnel-insulating film 203, floating gate electrode 205, inter-poly insulating film 206, control gate electrode 207 and cobalt disilicide film 208 are stacked in this order on the semiconductor substrate 201 between impurity-diffused layers 204.

A silicon dioxide film 209 is formed on each impurity-diffused layer 204. At this point, the top surface of the silicon dioxide film 209 is lower than the top surface of the cobalt disilicide film 208. A silicon nitride film 210 is formed so as to cover the top surface of the silicon dioxide film 209 and the side surfaces of the cobalt disilicide film 208.

A silicon nitride film 211 is formed on the silicon nitride films 210 and the cobalt disilicide films 208. The bottom surface of the silicon nitride film 211 is of concavo-convex shape according to the surface shapes of the underlying silicon nitride films 210 and the cobalt disilicide films 208. A silicon dioxide film 212 is formed on the silicon nitride film 211.

As a result of the concave silicon nitride films 210 being formed on the silicon dioxide films 209, it is possible to prevent trenches from being formed in the silicon dioxide films 209 during etching treatment of a natural oxide film using dilute fluorinated acid or the like in a salicide process. Consequently, it is also possible to prevent an increase in capacitance between word lines.

Next, a method of manufacturing a semiconductor device in accordance with the present embodiment will be described using cross-sectional process drawings shown in FIGS. 4 to 11. Each cross-sectional process drawing shows vertical cross sections in two directions, i.e., a first direction and a second direction orthogonal to the first direction for the same process.

Figure 4:
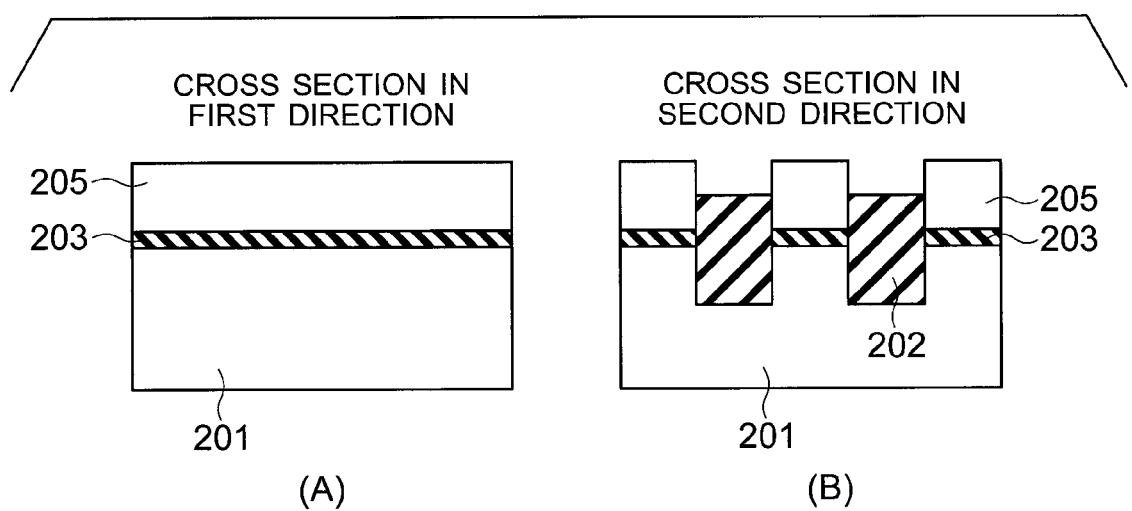
FIG. 4 is a schematic view illustrating cross sections in one process showing a method of manufacturing the semiconductor device in accordance with the aforementioned embodiment.

First, as shown in FIG. 4, an 8 nm thick tunnel-insulating film 203 made of, for example, a silicon dioxide film is deposited on a P-type semiconductor substrate 201 using a chemical vapor deposition (CVD) method. A 50 nm thick floating gate electrode 205 made of, for example, phosphorus-doped polysilicon is deposited on the tunnel-insulating film 203 using a CVD method. Then, a plurality of trenches are formed at a predetermined interval along the first direction by etching the semiconductor substrate 201, tunnel-insulating film 203 and floating gate electrode 205 by anisotropic etching, such as reactive ion etching (RIE). By burying, for example, a silicon dioxide film in the plurality of trenches, there are formed element-isolating regions 202.

Figure 5:
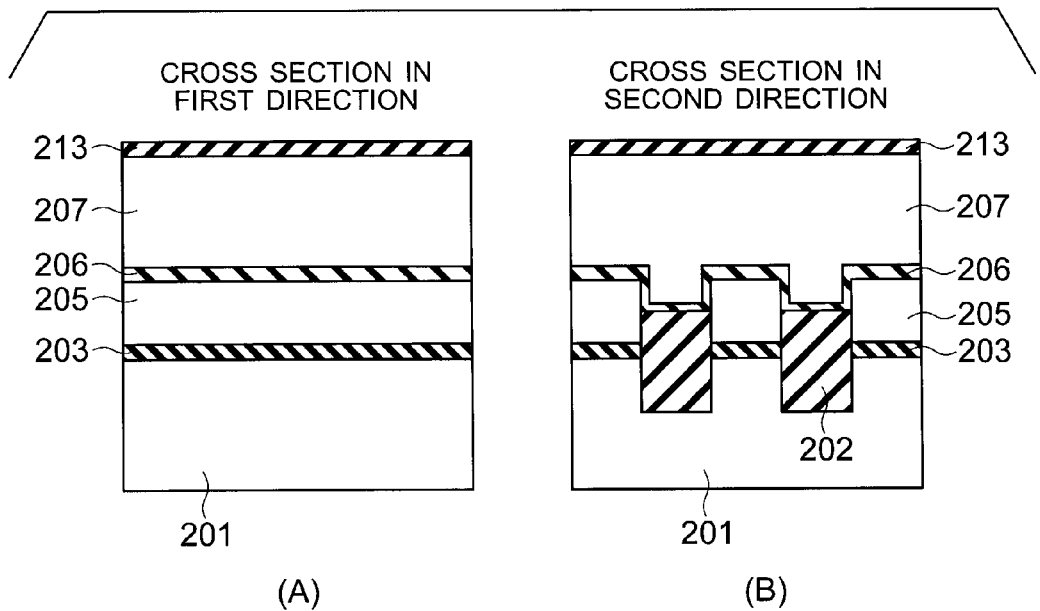
FIG. 5 is a schematic view illustrating cross sections in one process showing a method of manufacturing the semiconductor device in accordance with the aforementioned embodiment.

Next, as shown in FIG. 5, a 20 nm thick inter-poly insulating film 206 made of, for example, a silicon dioxide film (or silicon nitride film) is deposited on the entire surface of the semiconductor device using a CVD method. In addition, a 120 nm thick control gate electrode 207 made of, for example, phosphorus-doped polysilicon is deposited on the inter-poly insulating film 206. The inter-poly insulating film 206 is of concavo-convex shape according to the surface shapes of the underlying floating gate electrodes 205 and the element-isolating regions 202. The bottom surface of the control gate electrode 207 is also of concavo-convex shape according to the shape of the underlying inter-poly insulating film 206. The surface of the control gate electrode 207 is planarized using a chemical-mechanical polishing method. After planarization, a silicon nitride film 213, for example, is deposited on the control gate electrode 207 using a CVD method.

Figure 6:
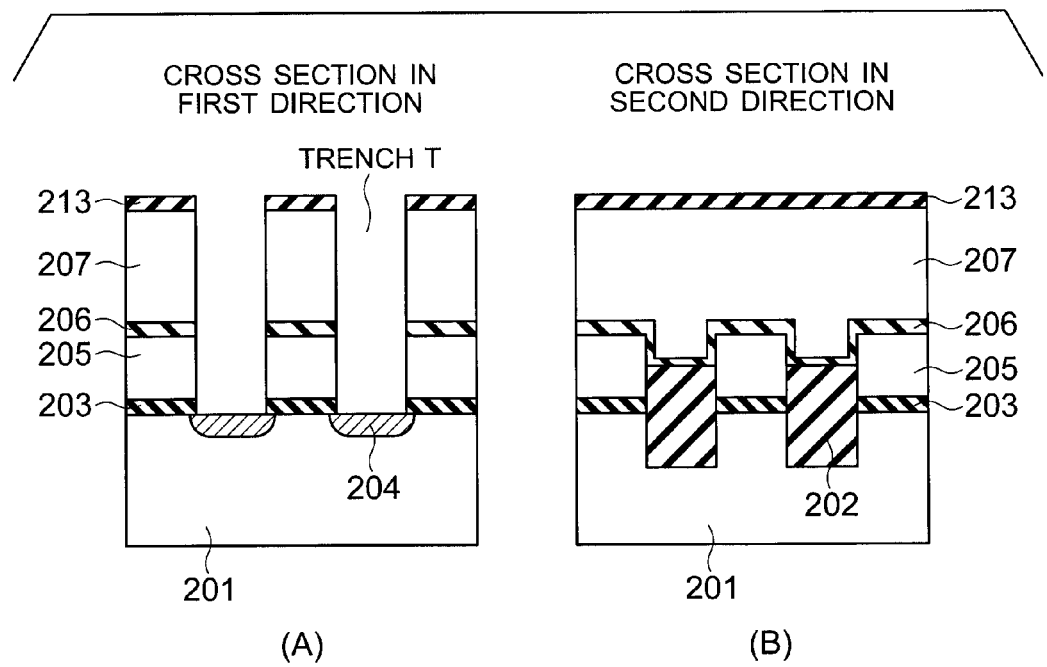
FIG. 6 is a schematic view illustrating cross sections in one process showing a method of manufacturing the semiconductor device in accordance with the aforementioned embodiment.

Next, as shown in FIG. 6, a plurality of trenches T are formed at a predetermined interval along the second direction by etching the tunnel-insulating film 203, floating gate electrode 205, inter-poly insulating film 206, control gate electrode 207 and silicon nitride film 213 by anisotropic etching, such as reactive ion etching (RIE). As a result, there are formed word lines. Accordingly, the second direction is the word line direction and the first line is the bit line direction. Then, the impurity-diffused layers 204 are formed by ion-implanting an impurity, such as phosphorous, and applying heat treatment.

Figure 7:
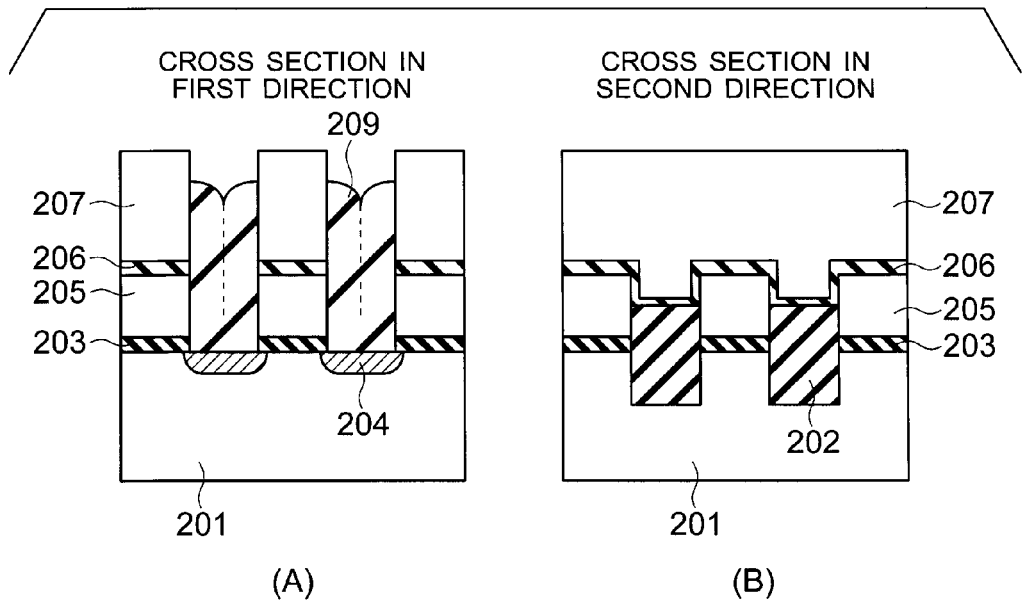
FIG. 7 is a schematic view illustrating cross sections in one process showing a method of manufacturing the semiconductor device in accordance with the aforementioned embodiment.

Next, as shown in FIG. 7, a silicon dioxide film 209, for example, is deposited using a CVD method and the silicon dioxide film 209 and the silicon nitride film 213 are etched by RIE or the like to expose the surface of the control gate electrode 207. When performing this etching, the top surface of the silicon dioxide film 209 is made lower than the top surface of the control gate electrode 207.

Figure 8:
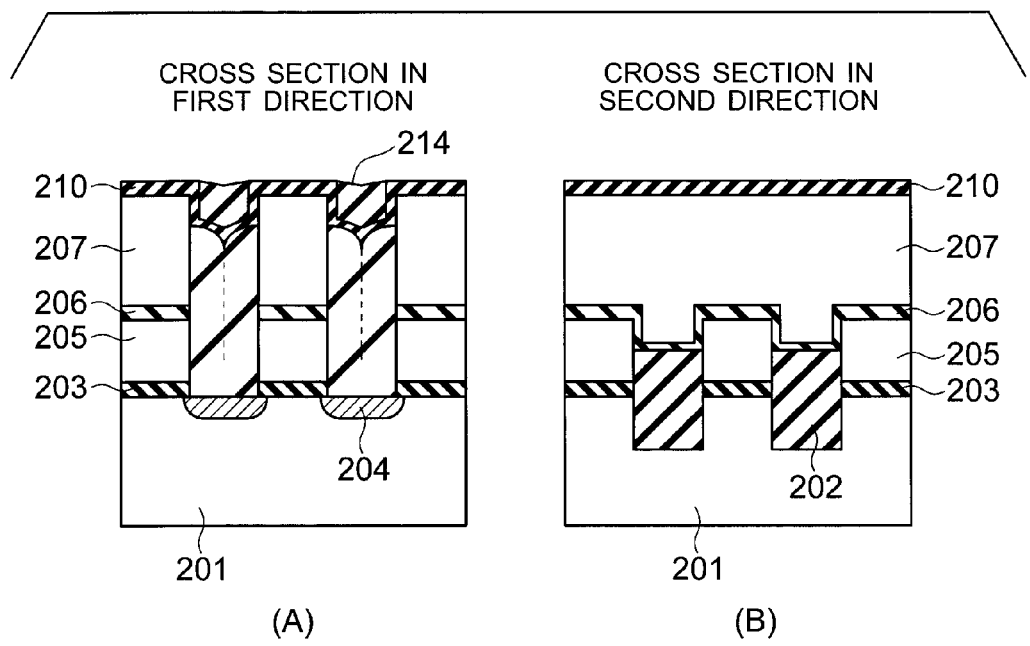
FIG. 8 is a schematic view illustrating cross sections in one process showing a method of manufacturing the semiconductor device in accordance with the aforementioned embodiment.

Next, as shown in FIG. 8, a silicon nitride film 210 is deposited using a CVD method. In addition, a silicon dioxide film 214, for example, is deposited on the silicon nitride film 210. Then, the silicon dioxide film 214 is etched back by RIE, so that only the portion of the silicon nitride film 210 located on the control gate electrode 207 is exposed. The silicon nitride film 210 is of concavo-convex shape according to the surface shapes of the underlying silicon dioxide film 209 and the control gate electrode 207.

Figure 9:
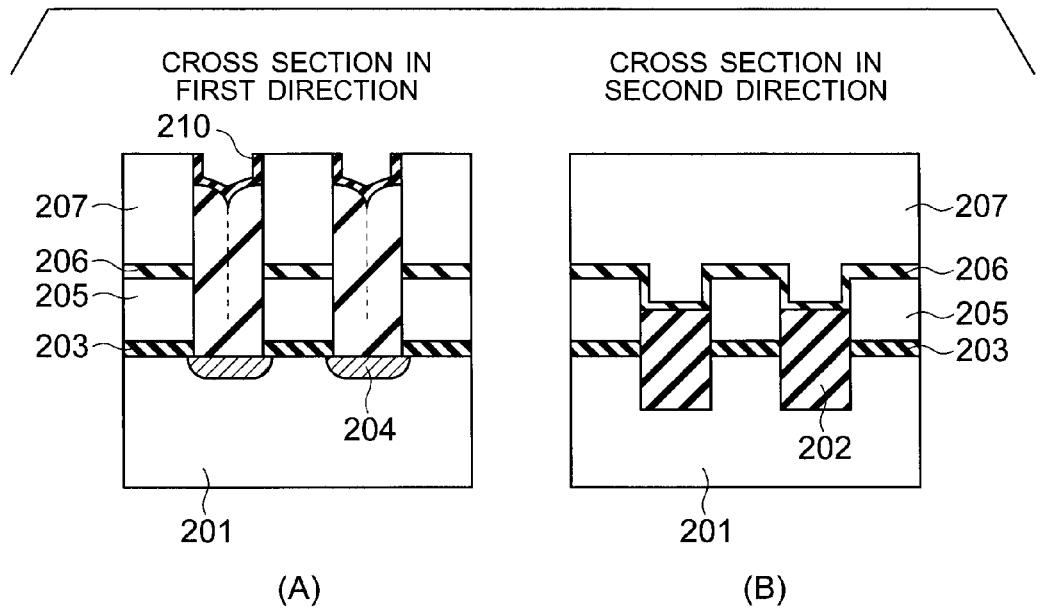
FIG. 9 is a schematic view illustrating cross sections in one process showing a method of manufacturing the semiconductor device in accordance with the aforementioned embodiment.

Next, as shown in FIG. 9, the silicon nitride film 210 on the control gate electrode 207 is etched by RIE or the like, and a natural oxide film present on the surface of the control gate electrode 207 is removed by treatment using a chemical solution, such as dilute fluorinated acid. When removing this natural oxide film, the silicon dioxide film 214 is also removed. At this time, the silicon dioxide film 209 is not removed since the surface thereof is covered by the silicon nitride film 210 and, therefore, trenches are not formed.

Figure 10:
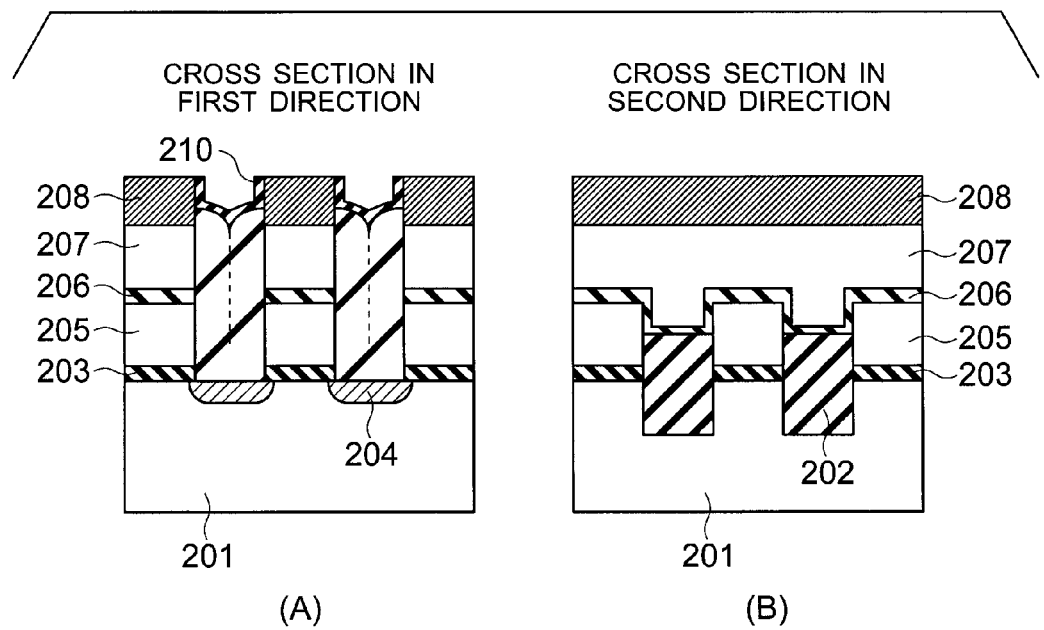
FIG. 10 is a schematic view illustrating cross sections in one process showing a method of manufacturing the semiconductor device in accordance with the aforementioned embodiment.

Next, as shown in FIG. 10, a cobalt disilicide film 208 is formed on the control gate electrode 207 to a thickness of 50 nm using a cobalt salicide process. Here, the cobalt salicide process refers to a process of first depositing a cobalt film using a sputtering method, then forming a cobalt monosilicide (CoSi) film by reacting the deposited cobalt film with the surface of the control gate electrode (phosphorus-doped polysilicon) 207 by heat treatment at approximately 400° C. to 600° C., removing an unreacted cobalt film using a chemical solution, such as a hydrochloric acid peroxide mixture, sulfuric acid peroxide mixture or ammonia peroxide mixture, and changing the cobalt monosilicide film to a cobalt disilicide (CoSi$_2$) film by once again applying heat treatment at approximately 700° C. to 850° C.

Figure 11:
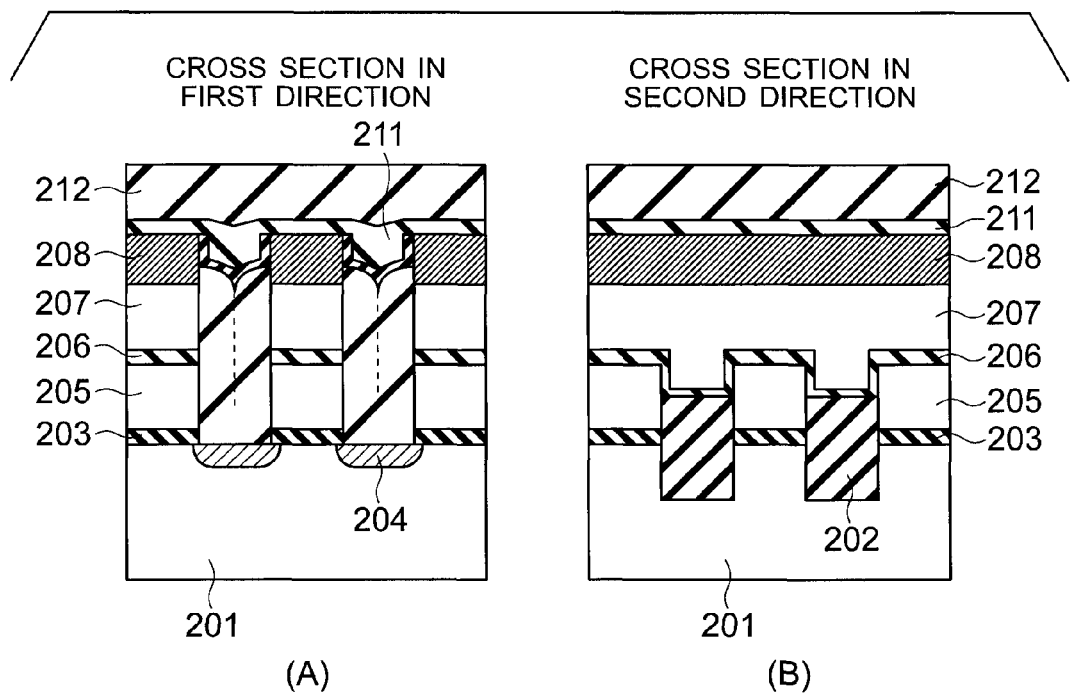
FIG. 11 is a schematic view illustrating cross sections in one process showing a method of manufacturing the semiconductor device in accordance with the aforementioned embodiment.

Next, as shown in FIG. 11, a 30 nm thick silicon nitride film 211 is deposited using a CVD method. In addition, a 200 nm thick silicon dioxide film 212 is deposited on the silicon nitride film 211. The surface of the silicon dioxide film 212 is planarized using a CMP method.

Then, contact holes are formed and, by burying conducting layers in these contact holes, the top surfaces of the cobalt disilicide film 208 and impurity-diffused layer 204 are connected to a wiring layer (not shown in the figure) formed on the silicon dioxide film 212.

In the semiconductor device thus formed, no trenches are formed in the silicon dioxide film 209 between word lines, thereby making it possible to prevent an increase in capacitance between word lines.

When etching the silicon dioxide film 209 (FIG. 6), it is only necessary to remove only as much of the silicon dioxide film 209 as is necessary to leave the silicon nitride film 210 between word lines in a subsequent process. Preferably, the top surface of the silicon dioxide film 209 is positioned at least two-thirds of a distance between word lines lower than the top surface of the control gate electrode 207. In addition, the top surface of the silicon dioxide film 209 is positioned higher than the top surface of the inter-poly insulating film 206, in order to prevent the inter-poly insulating film 206 from being damaged by etching, such as RIE.

The thickness of the silicon nitride film 210 is preferably at least 2 nm and no greater than one-third of the distance between word lines, so that the silicon dioxide film 209 is not etched when removing a natural oxide film by treatment using a chemical solution, such as dilute fluorinated acid, and the silicon nitride film 210 is selectively left over between word lines.

Comparative Example

Now, a semiconductor device and a method of manufacturing the semiconductor device according to a comparative example will be described using FIGS. 12 to 15. Here, only cross sections in the first direction (bit line direction) are shown for comparison with the above-described embodiment. The comparative example is the same in process as the above-described embodiment up to the process of forming word lines and the impurity-diffused layer 204 (corresponding to FIG. 6) and, therefore, these processes will not be explained further.

Figure 12:
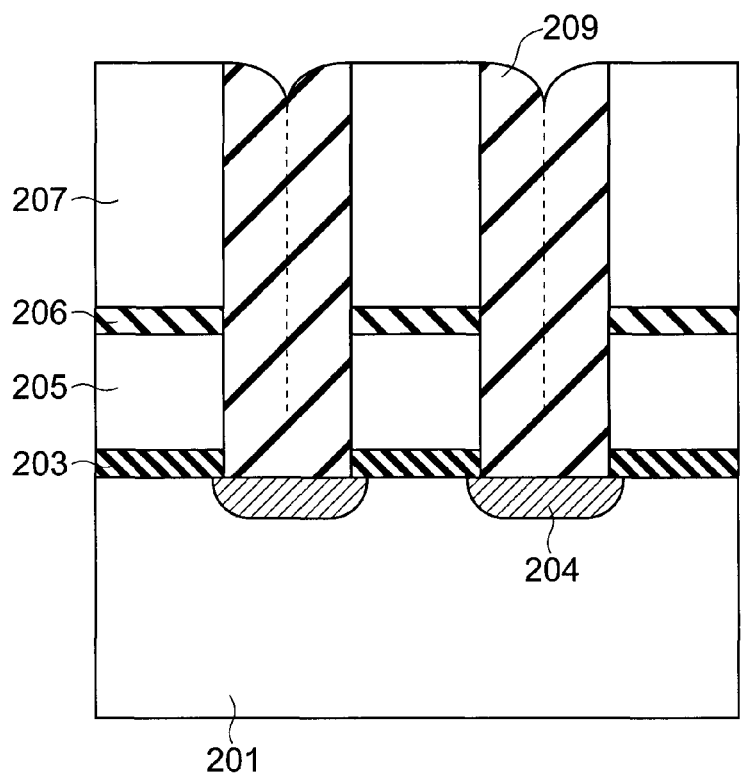
FIG. 12 is a schematic view illustrating a cross section in one process showing a method of manufacturing a semiconductor device in accordance with a comparative example.

Then, as shown in FIG. 12, a silicon dioxide film 209 is deposited using a CVD method, and the silicon dioxide film 209 and the silicon nitride film 213 are etched by RIE or the like so that the surface of the control gate electrode 207 is exposed. The top surface of the silicon dioxide film 209 is the same in position as the top surface of the control gate electrode 207.

Figure 13:
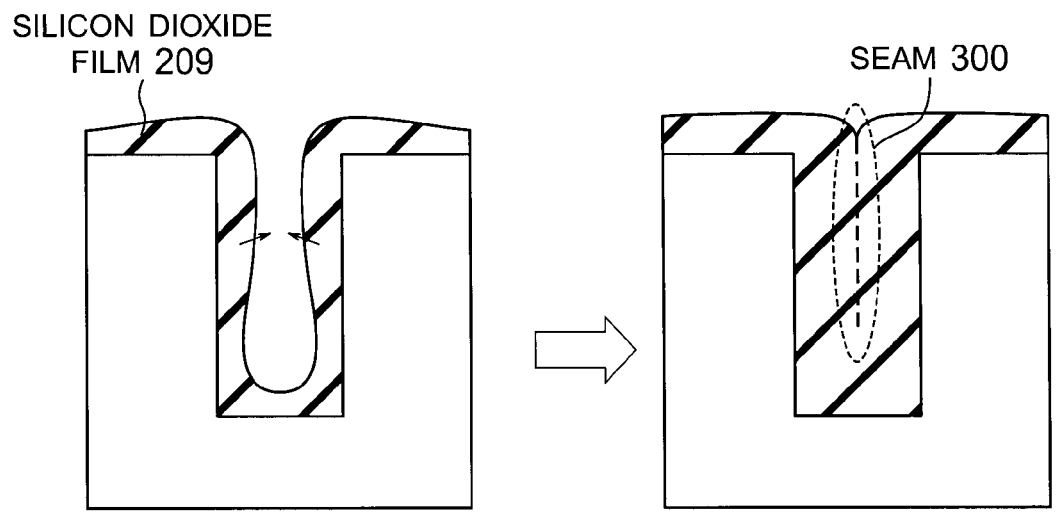
FIG. 13 is a schematic view illustrating a cross section in one process showing a method of manufacturing a semiconductor device in accordance with a comparative example.

Here, when forming the silicon dioxide film 209 within such a thin, deep trench T as one between word lines using a CVD method, the surfaces of portions of the silicon dioxide film being deposited on the side surfaces of each word line come into contact with each other in the course of film forming, as shown in FIG. 13. After such contact, a source gas for CVD is no longer supplied. Consequently, there is formed a joint line (seam) 300 in the center of the silicon dioxide film within each trench T.

Figure 14:
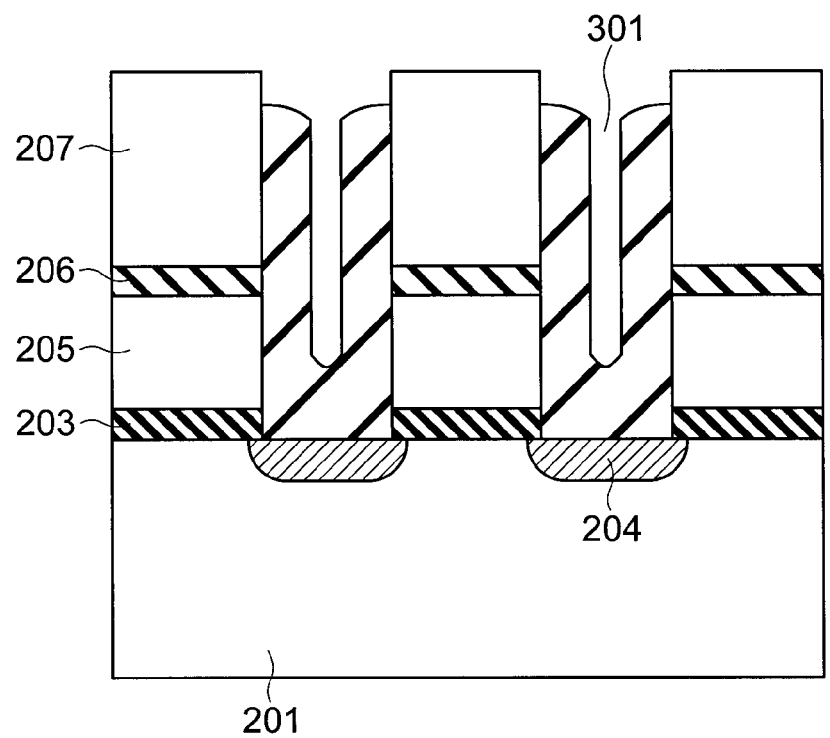
FIG. 14 is a schematic view illustrating a cross section in one process showing a method of manufacturing a semiconductor device in accordance with a comparative example.

Next, a natural oxide film present on the surface of the control gate electrode 207 is removed by treatment using a chemical solution, such as dilute fluorinated acid. Since the joint line (seam) 300 in the center of the silicon dioxide film 209 is extremely vulnerable to etching using dilute fluorinated acid or the like, the seam 300 expands in a groove-like manner due to this treatment of removing the natural oxide film, as shown in FIG. 14, resulting in the formation of a trench 301.

Figure 15:
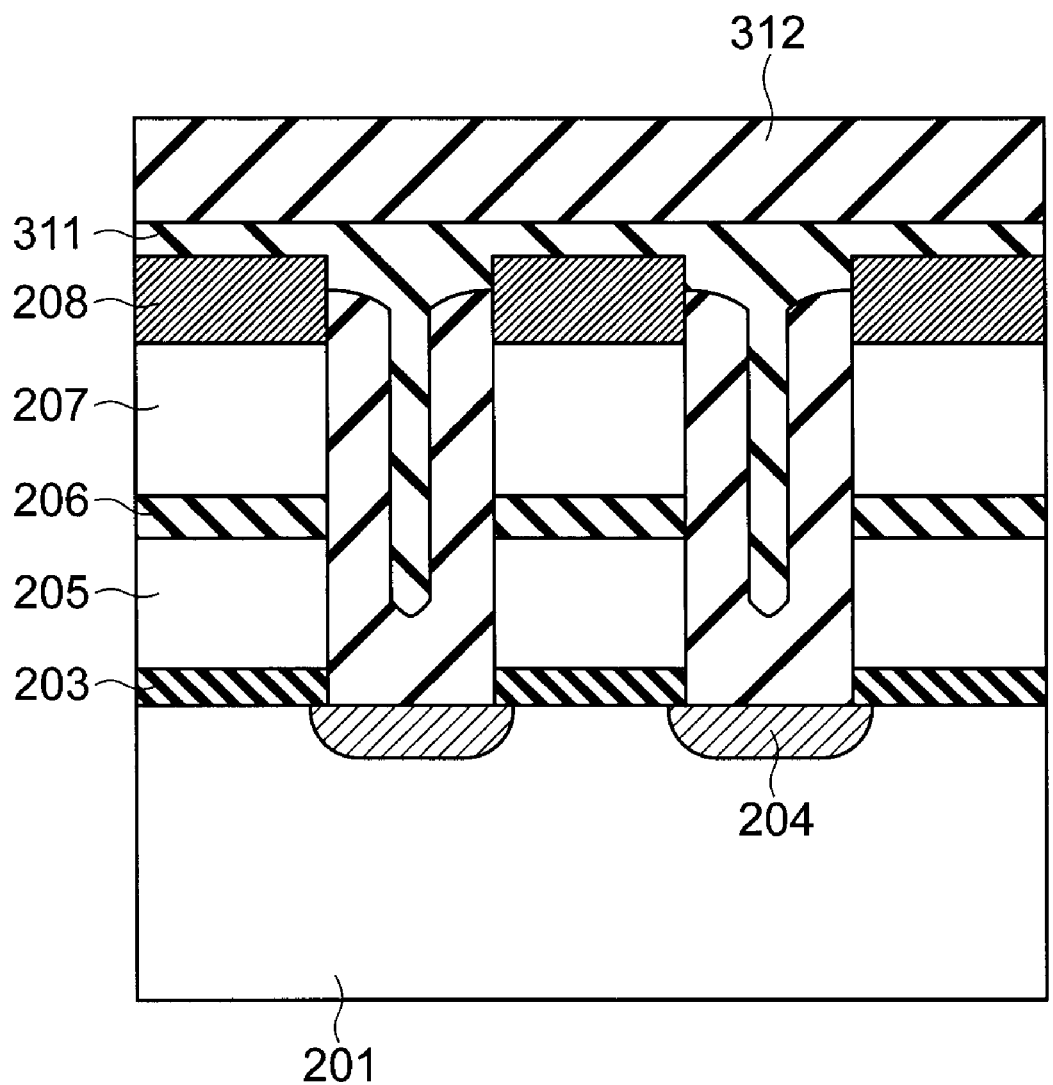
FIG. 15 is a schematic view illustrating a cross section in one process showing a method of manufacturing a semiconductor device in accordance with a comparative example.

Next, a cobalt disilicide film 208 is formed on the control gate electrode 207 using a salicide process. Then, as shown in FIG. 15, a silicon nitride film 311 and a silicon dioxide film 312 are deposited.

At this time, the silicon nitride film 311 having a large dielectric constant is buried in the trench 301, thereby increasing parasitic capacitance between word lines. Such an increase in capacitance between word lines causes the signal writing/reading speed of a flash memory device to decrease.

As described above, the semiconductor device according to the comparative example is such that trenches are formed in a silicon dioxide film between word lines and, as the result of a silicon nitride film being buried in the trenches, capacitance between word lines increases.

On the other hand, in the semiconductor device according to the above-described embodiment, it is possible to prevent trenches from being formed in a silicon dioxide film between word lines even if a low-resistance silicide film, such as a cobalt silicide film, is formed on a control gate electrode using a salicide process in order to reduce the parasitic resistance of word lines. Accordingly, it is possible to reduce the parasitic resistance of word lines without increasing capacitance therebetween. Consequently, it is possible to facilitate miniaturization without degrading the performance of a flash memory device.

While in the above-described embodiment, a cobalt silicide film is formed using a salicide process, nickel or titanium may be used rather than cobalt.

What is claimed is:

1. A semiconductor device comprising:
    a semiconductor layer;
    a plurality of charge-accumulating layers formed at a predetermined interval from each other on said semiconductor layer through a first insulating film;
    a second insulating film formed on each of said plurality of charge-accumulating layer;
    a control gate including a silicide film formed on said second insulating film;
    a third insulating film formed between said control gates so that a top most surface of said third insulating film is lower than a top surface of said control gate but is higher than a top surface of said second insulating film;
    a fourth insulating film formed into a concave shape so as to cover the top most surface of said third insulating film and a side surfaces of said control gate positioned higher than the top most surface of said third insulating film; and
    a fifth insulating film formed on said control gate and said fourth insulating film,
    wherein a region directly adjacent to neighboring stacks, each of said neighboring stacks including the first insulating film, the charge-accumulating layer, and the second insulating film, is occupied by a third insulating film.

2. The semiconductor device according to claim 1, wherein said silicide film includes at least any one of a titanium silicide, cobalt silicide and nickel silicide.

3. The semiconductor device according to claim 1, wherein the top surface of said third insulating film is positioned at least two-thirds of a distance between control gates lower than the top surface of said control gate.

4. The semiconductor device according to claim 1, wherein the thickness of said fourth insulating film is no greater than one-third of a distance between control gates.

5. The semiconductor device according to claim 1, wherein said third insulating film is a silicon dioxide film.

6. The semiconductor device according to claim 1, wherein said fourth insulating film is a silicon nitride film.

7. The semiconductor device according to claim 1, wherein said fifth insulating film is a silicon nitride film.

8. The semiconductor device according to claim 1, wherein a dielectric constant of the third insulating film is lower than a dielectric constant of the fourth insulating film and a dielectric constant of the fifth insulating film.

* * * * *